(12) United States Patent
Holmgren et al.

(10) Patent No.: US 8,946,594 B2
(45) Date of Patent: Feb. 3, 2015

(54) OPTICAL DESIGN FOR LINE GENERATION USING MICROLENS ARRAY

(71) Applicant: Applied Materials, Inc., Santa Clara, CA (US)

(72) Inventors: Douglas E. Holmgren, Portland, OR (US); Samuel C. Howells, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 318 days.

(21) Appl. No.: 13/649,028

(22) Filed: Oct. 10, 2012

(65) Prior Publication Data

US 2013/0112667 A1 May 9, 2013

Related U.S. Application Data

(60) Provisional application No. 61/555,938, filed on Nov. 4, 2011.

(51) Int. Cl.

| | |
|---|---|
| *B23K 26/06* | (2014.01) |
| *G02B 27/10* | (2006.01) |
| *H01L 21/268* | (2006.01) |
| *G02B 27/09* | (2006.01) |
| *B23K 26/00* | (2014.01) |

(52) U.S. Cl.
CPC .............. *H01L 21/268* (2013.01); *B23K 26/06* (2013.01); *G02B 27/10* (2013.01); *G02B 27/0961* (2013.01); *G02B 27/0966* (2013.01); *B23K 26/00* (2013.01); *G02B 27/0911* (2013.01)
USPC ...................................... 219/121.75; 359/618

(58) Field of Classification Search
CPC .......... G02B 27/10; B23K 26/06; H01L 21/00
USPC .............. 219/121.65–121.72, 121.73, 121.75; 359/618, 641
See application file for complete search history.

(56) References Cited

U.S. PATENT DOCUMENTS

| | | | |
|---|---|---|---|
| 5,900,980 A | 5/1999 | Yamazaki et al. | |
| 6,366,308 B1 | 4/2002 | Hawryluk et al. | |
| 6,448,568 B1 | 9/2002 | Allen et al. | |
| 6,639,201 B2 | 10/2003 | Almogy et al. | |
| 6,771,686 B1 * | 8/2004 | Ullman et al. | 372/92 |

(Continued)

OTHER PUBLICATIONS

International Search Report and Written Opinion of the International Searching Authority mailed Mar. 21, 2013 in PCT/US12/059991.

*Primary Examiner* — Samuel M Heinrich
(74) *Attorney, Agent, or Firm* — Patterson & Sheridan, LLP

(57) ABSTRACT

Embodiments of the invention provide an apparatus including a substrate support, a source of laser radiation emitting laser radiation along an optical path, and an illumination optics disposed along the optical path. The illumination optics includes a set of slow-axis and fast-axis lenses. The apparatus further includes a homogenizer disposed between of the illumination optics and the substrate support along the optical path. The homogenizer includes a first and a second micro-optic lenslet arrays of cylindrical lenses, wherein the second micro-optic lenslet array of cylindrical lenses has a relatively larger lenslet pitch than that of the first micro-optic lenslet array of cylindrical lenses, and lenslet axes of the first micro-optic lenslet array and lenslet axes of the second micro-optic lenslet array are oriented along an axis that is parallel to a fast axis of the source of laser radiation.

21 Claims, 5 Drawing Sheets

(56) References Cited

U.S. PATENT DOCUMENTS

| | | |
|---|---|---|
| 7,109,435 B2 | 9/2006 | Tsukihara et al. |
| 7,129,440 B2 | 10/2006 | Adams et al. |
| 7,265,908 B2 | 9/2007 | Anikitchev |
| 7,277,229 B2 * | 10/2007 | Kato ............................ 359/618 |
| 7,615,722 B2 | 11/2009 | Govorkov et al. |
| 2006/0045144 A1 | 3/2006 | Karlsen et al. |
| 2006/0102599 A1 | 5/2006 | Adams et al. |
| 2006/0102607 A1 | 5/2006 | Adams et al. |
| 2006/0221459 A1 | 10/2006 | Sagan |
| 2006/0222041 A1 | 10/2006 | Moriwaka |
| 2006/0264060 A1 | 11/2006 | Ramaswamy et al. |
| 2008/0002253 A1 | 1/2008 | Jennings et al. |
| 2008/0280458 A1 | 11/2008 | Tsukihara |
| 2009/0032511 A1 | 2/2009 | Adams et al. |
| 2009/0084986 A1 | 4/2009 | Adams et al. |
| 2010/0266268 A1 | 10/2010 | Jennings et al. |

\* cited by examiner

OPTICAL DESIGN FOR LINE GENERATION USING MICROLENS ARRAY

CROSS-REFERENCE TO RELATED APPLICATIONS

This application claims benefit of U.S. provisional patent application Ser. No. 61/555,938, filed Nov. 4, 2011, which is herein incorporated by reference.

BACKGROUND

1. Field of the Invention

Embodiments of the present invention generally relate to thermal processing of semiconductor substrates. In particular, the invention relates to laser thermal processing of semiconductor substrates.

2. Description of the Related Art

Thermal processing is required in the fabrication of silicon and other semiconductor integrated circuits formed in silicon wafers or other substrates such as glass panels for displays. The required temperatures may range from relatively low temperatures of less than 250° C. to greater than 1000° C., 1200° C., or even 1400° C. and may be used for a variety of processes such as dopant implant annealing, crystallization, oxidation, nitridation, silicidation, and chemical vapor deposition as well as others.

For the very shallow circuit features required for advanced integrated circuits, it is desired to reduce the total thermal budget in achieving the required thermal processing. The thermal budget may be considered as the total time at high temperatures necessary to achieve the desired processing temperature. The time that the wafer needs to stay at the highest temperature can be very short. For example, Rapid thermal processing (RTP) uses radiant lamps which can be very quickly turned on and off to heat only the wafer and not the rest of the chamber. Pulsed laser annealing using very short (about 20 ns) laser pulses is effective at heating only the surface layer and not the underlying wafer, thus allowing very short ramp up and ramp down rates.

A more recently developed approach in various forms, sometimes called thermal flux laser annealing or dynamic surface annealing (DSA), uses a tapered light pipe and anamorphic imaging optics to generate very intense beams of light that strike the wafer as a thin long line of radiation. The line is then scanned over the surface of the wafer in a direction perpendicular to the long dimension of the line beam. However, it has been reported that the light pipe used to homogenize and scale the image along the slow axis (i.e., the line length direction) is fragile, difficult to manufacture, and subject to misalignment to the other optics in the system.

Therefore, there is a need for a more efficient and economical optical system for projecting a laser line image that is less sensitive to alignment errors and less fragile.

SUMMARY OF THE INVENTION

The present invention generally relates to thermal processing of semiconductor substrates. In one embodiment, a thermal processing apparatus for processing a semiconductor substrate is provided. The apparatus includes a substrate support, a source of laser radiation emitting laser radiation along an optical path between the source of laser radiation and the substrate support, an illumination optics disposed along the optical path comprising a set of slow-axis lenses having at least a first cylindrical lens and a second cylindrical lens spaced apart from each other, and a set of fast-axis lenses having at least a first cylindrical lens and a second cylindrical lens spaced apart from each other, the set of fast-axis lenses being disposed between the first cylindrical lens and the second cylindrical lens of the set of slow-axis lenses, a homogenizer disposed between of the illumination optics and the substrate support along the optical path for homogenizing laser radiation from the source of laser radiation, the homogenizer comprising a first micro-optic lenslet array of cylindrical lenses, and a second micro-optic lenslet array of cylindrical lenses, the second micro-optic lenslet array of cylindrical lenses having a relatively larger lenslet pitch than that of the first micro-optic lenslet array of cylindrical lenses. In one example, lenslet axes of the first micro-optic lenslet array and lenslet axes of the second micro-optic lenslet array are oriented along an axis that is parallel to a fast axis of the source of laser radiation. The apparatus further comprises a plurality of condensing lenses disposed between the homogenizer and the substrate support along the optical path for focusing line image at a surface of the substrate, the plurality of condensing lenses having at least five lenses with all spherical surfaces.

In another embodiment, a thermal processing apparatus for processing a semiconductor substrate is provided. The apparatus includes a substrate support, an array of laser diode bars emitting laser radiation at a first wavelength, the array of laser diode bars being arranged in plural parallel rows extending along a slow axis, the rows of laser diode bars being arranged in a stack along a fast axis, wherein the slow axis and the fast axis are orthogonal to an optical path between the array of laser diode bars and the substrate support, an illumination optics disposed between the array of laser diode bars and the substrate support along the optical path, the illumination optics comprising a polarizing beamsplitter, a set of slow-axis lenses having at least a first cylindrical lens and a second cylindrical lens spaced apart from each other, a set of fast-axis lenses having at least a first cylindrical lens and a second cylindrical lens spaced apart from each other, the set of fast-axis lenses being disposed between the first cylindrical lens and second cylindrical lens of the set of slow-axis lenses, a dichroic mirror disposed downstream of the set of fast-axis lenses and configured to redirect laser radiation of a second and a third wavelengths reflected from the heated substrate to a pyrometer, and a waveplate disposed downstream of the dichroic mirror to rotate polarization of laser radiation by 90 degrees, a homogenizer disposed between the illumination optics and the substrate support along the optical path for homogenizing laser radiation along the slow axis, the homogenizer comprising a first micro-optic lenslet array of cylindrical lenses, and a second micro-optic lenslet array of cylindrical lenses, the second micro-optic lenslet array of cylindrical lenses having a relatively larger lenslet pitch than that of the first micro-optic lenslet array of cylindrical lenses, and a condensing lens set disposed between the homogenizer and the substrate support along the optical path for focusing line image at a surface of the substrate, the condensing lens set having at least five lenses with all spherical surfaces.

In yet another embodiment, a thermal processing apparatus for processing a semiconductor substrate is provided. The apparatus includes a substrate support, an array of laser diode bars arranged in plural parallel rows extending along a slow axis, the rows of laser diode bars being arrayed in a stack along a fast axis, the slow-axis being generally perpendicular to the fast-axis, an illumination optics disposed between the array of laser diode bars and the substrate support, the illumination optics comprising a set of slow-axis lenses having at least a first cylindrical lens and a second cylindrical lens spaced apart from each other, the set of slow-axis lenses collimate laser beam radiation in the slow axis, and a set of fast-axis lenses having at least a first cylindrical lens and a second cylindrical lens spaced apart from each other, the set of fast-axis lenses being disposed between the first and second cylindrical lenses of the set of slow-axis lenses to collimate laser beam radiation in the fast axis, and a homogenizer disposed between the illumination optics and the substrate support for homogenizing laser beam radiation collimated by the illumination optics along the slow axis, the homogenizer comprising a first micro-optic lenslet array of cylindrical lenses, and a second micro-optic lenslet array of cylindrical lenses disposed parallel and spaced apart from the first micro-optic lenslet array of cylindrical lenses, the second micro-optic lenslet array of cylindrical lenses having a relatively larger lenslet pitch than that of the first micro-optic lenslet array of cylindrical lenses, and a condensing lens set disposed between the homogenizer and the substrate support along the optical path for focusing line image at a surface of the substrate, the condensing lens set having at least five lenses with all spherical surfaces.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
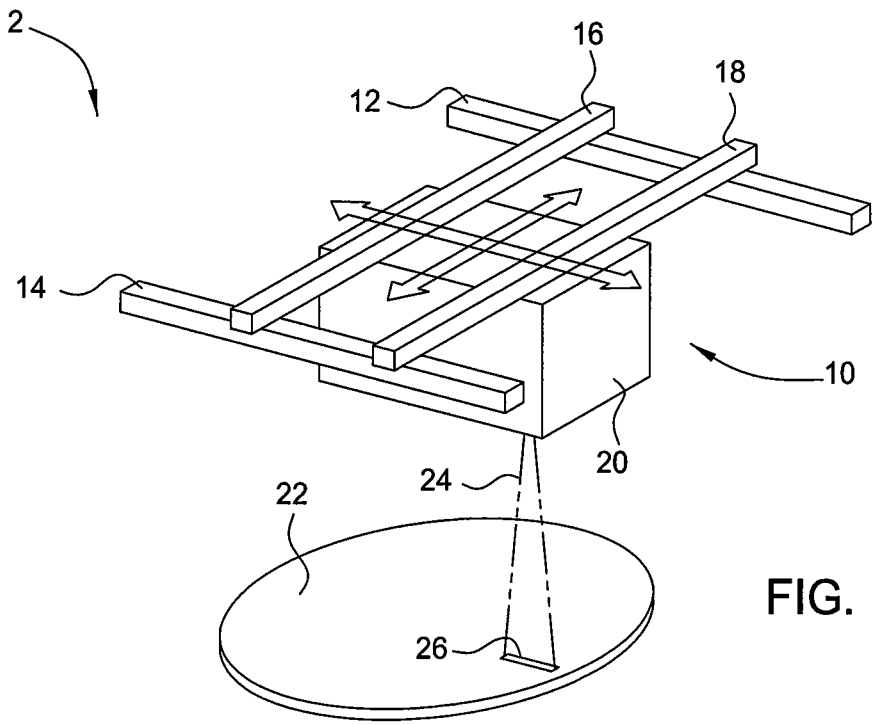
FIG. 1 is an exemplary perspective view of a thermal flux laser annealing apparatus according to one embodiment of the present invention.

FIG. 1 is an exemplary perspective view of a thermal flux laser annealing apparatus according to one embodiment of the present invention. The apparatus 2 generally includes a gantry structure 10 for two-dimensional scanning. The gantry structure 10 may include a pair of fixed parallel rails 12, 14. Two parallel gantry beams 16, 18 are fixed together a set distance apart and supported on the fixed rails 12, 14 and are controlled by a motor (not shown) and drive mechanism (not shown) to slide on rollers or ball bearings (not shown) together along the fixed rails 12, 14. A beam source 20 is slidably supported on the gantry beams 16, 18, and may be suspended below the beams 16, 18 which are controlled by unillustrated motors and drive mechanisms to slide along them. A substrate, for example, a silicon wafer 22, may be stationarily supported below the gantry structure 10. The beam source 20, as will be discussed in more detail below, generally includes a laser light source and optics to produce a beam 24 that strikes the wafer 22 as a line beam 26 extending generally parallel to the fixed rails 12, 14, referring hereinafter as the slow direction (i.e., the line length direction).

Although not illustrated here, the gantry structure 10 may further include a Z-axis stage for moving the laser light source and optics in a direction generally parallel to the fan-shaped beam 24 to thereby controllably vary the distance between the beam source 20 and the wafer 22 and thus control the focusing of the line beam 26 on the wafer 22. Exemplary dimensions of the line beam 26 include a length of about 5 mm to about 1 cm, for example about 12 mm, and a width of about 50 um to about 90 um, for example about 75 um, with an exemplary power density of 220 kW/cm$^2$. Alternatively, the beam source and associated optics may be stationary while the wafer is supported on a stage (e.g., an X-Y stage) which scans it in two dimensions.

In one embodiment, the gantry beams 16, 18 may be set at a particular position along the fixed rails 12, 14 and the beam source 20 is moved at a uniform speed along the gantry beams 16, 18 to scan the line beam 26 perpendicularly to its long dimension in a direction referred to as the fast direction (i.e., the line width direction). Alternatively, the beam source 20 may be stationary while moving the wafer 22 with respect to the beam source 20, thereby scanning the line beam 26 from one side of the wafer 22 to the other to irradiate a 1 cm swath of the wafer 22. The line beam 26 is narrow enough and the scanning speed in the fast direction fast enough that a particular area of the wafer is only momentarily exposed to the optical radiation of the line beam 26 but the intensity at the peak of the line beam is enough to heat the surface region to very high temperatures. However, the deeper portions of the wafer 22 are not significantly heated and therefore act as a heat sink to quickly cool the surface region. Once the fast scan has been completed, the gantry beams 16, 18 or the wafer 22 moving by an X-Y stage is moved to a new position such that the line beam 26 is moved along its long dimension extending along the slow axis. The fast scanning is then performed again to irradiate a neighboring swath of the wafer 22. The alternating fast and slow scanning are repeated, perhaps in a serpentine path of the beam source 20, until the entire wafer 22 has been thermally processed.

Figure 2:
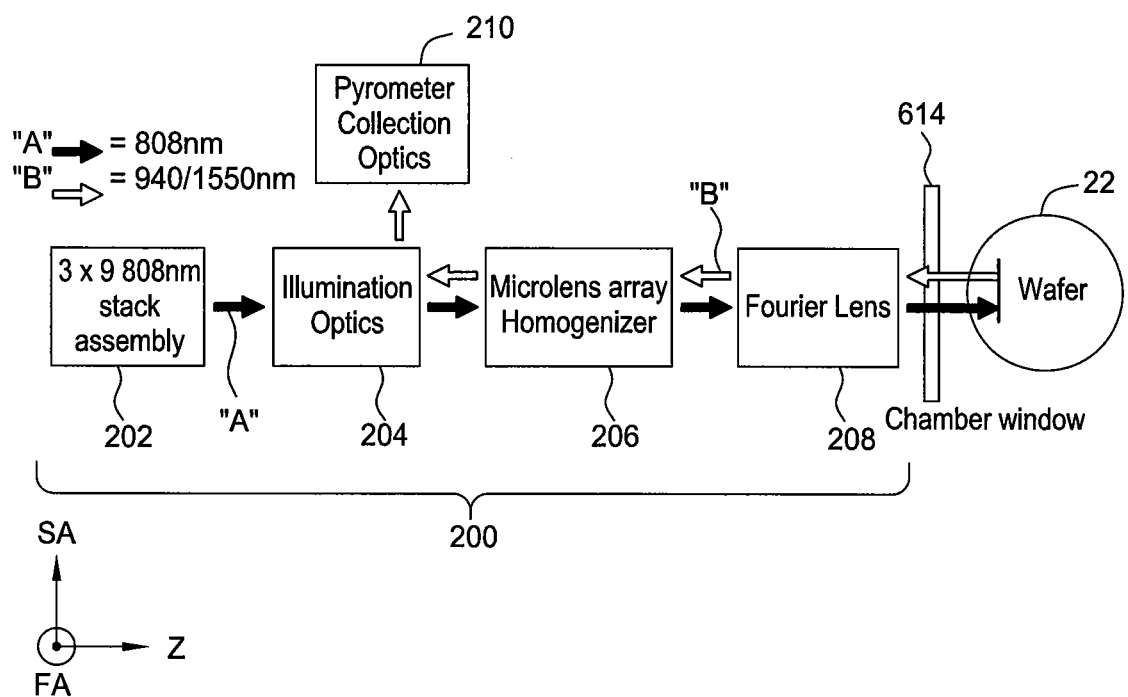
FIG. 2 conceptually illustrates an optical system having laser diode bar array and optics working altogether to produce and focus a uniform distribution of laser light to be directed onto a wafer.

An exemplary beam source 20 is conceptually illustrated in FIG. 2, which shows an optical system 200 comprising laser diode bar array and optics working together to produce a uniform distribution of laser light to be focused on the wafer 22. In one embodiment, the optical system 200 generally includes laser diode bar array 202, an illumination optics 204, a homogenizer 206 which may be a microlens array, a Fourier Transform lens (or field lens) 208, and a pyrometer collection optics 210. The arrow "A" indicates laser radiation at about 808 nm is produced from the laser diode bar array 202 and transmits in order through the illumination optics 204, the microlens array homogenizer 206, the Fourier Transform lens 208, and to the wafer. A portion of thermal radiation emitted from the heated wafer is collected by the Fourier Transform lens 208 and passes through the microlens array homogenizer 206, the illumination optics 204 back towards the laser diode bar array 202. A beam reflector (not shown) may be arranged between the microlens array homogenizer 206 and the illumination optics 204 to direct a portion of thermal radiation emitted at the pyrometer wavelengths (940 nm, 1550 nm, arrow "B") from the heated wafer to the pyrometer collection optics 210, thereby monitoring the temperature of the wafer being thermally processed. To avoid or minimize the heat impact on the laser diode bar array 202, the illumination optics 204 may include one or more beam dumps (not shown) to collect thermal radiation reflected from the heated wafer. The optical system 200 will be discussed in more detail below.

Figure 3:
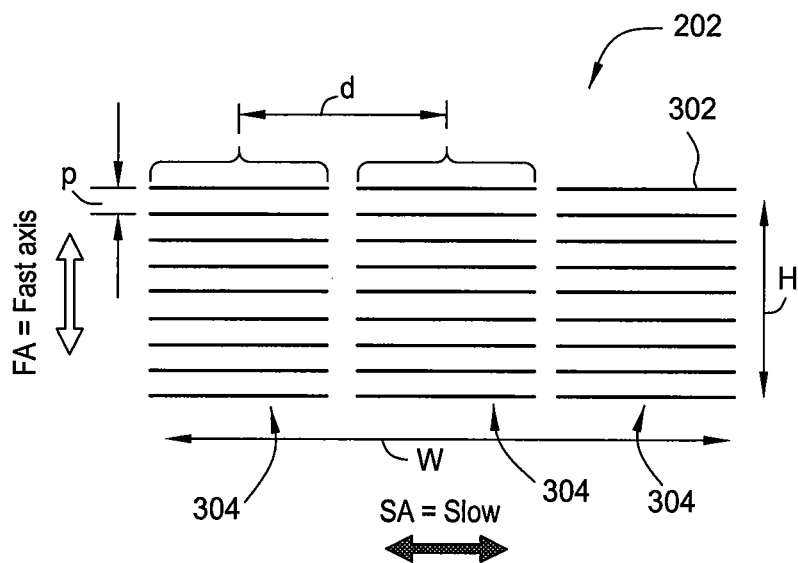
FIG. 3 illustrates an end plan view of the laser diode bar array.

FIG. 3 illustrates an end plan view of the laser diode bar array 202. The laser diode bar array 202 may have multiple diode bars 302 each including a desired number of laser diodes (not shown), for example, about 25 laser diodes mounted and separated by a 400 μm pitch on the diode bar 302. The diode bars 302 may be arranged in parallel from one another forming a laser bar stack 304. The number of diode bars 302 and stack 304 may vary depending upon the output power required for the process. In cases where the output requirement is at least 1600 W obtainable from the full diode bar array, it may be advantageous to limit the total power from a given diode bar to increase the service life of the laser diode. For example, the total output power for each diode bar 302 may be limited to about 60 W. In one embodiment where a pitch is about 1.8 mm (height) and a diode bar length is about 10 mm, the power density/bar is about 330 W/cm². To compensate the lower light output, it has been determined that a total of 3 stacks 304 (in the slow axis direction) of 9 diode bars 302 (in the fast axis direction) may be required to meet the overall power requirement. Therefore, the laser diode bar array 202 has a total of 27 diode bars 302 grouped in a 3×9 array as shown.

Each diode bar 302 generally corresponds to a p-n junction configured to emit a beam at a wavelength suitable for thermal processing applications, for example, between about 190 nm and about 950 nm, with a particular application using illumination at 808 nm. Due to the geometry of the diode bar 302, the raw output beams from each discrete diode bar 302 is highly divergent and asymmetric in both fast and slow axes (both being perpendicular to the beam direction). Typical fast axis divergence is about 40° FWHM (Full Width Half Maximum) and slow axis divergence is about 10° FWHM. For most applications, it may be advantageous to reshape the output beam into one with a rectangular cross section using one or more optical elements. Due to higher divergence observed in the fast axis direction, an optical element, such as a cylindrical lens (not shown) may cover each of laser diode to collimate output beams with a divergence angle φ (a slow axis view of output beam divergence φ is shown FIG. 4) along the fast axis direction. In one embodiment, divergences of output beam through the optical system 200 along the slow axis are less than 7.5° FWHM (Full Width Half Maximum) and are less than 0.2° FWHM along the fast axis for all operating currents.

In one embodiment, the diode bar 302 may have a length of about 2 mm to about 20 mm, for example about 10 mm in the slow axis direction, and separates from the neighboring diode bar by a bar pitch "p" of about 0.5 mm to about 3 mm, for example about 1.8 mm or less in the fast axis direction. The stack spacing "d" (from center of stack to center of stack) may be between about 5 mm and about 25 mm, for example about 12 mm or less. The laser diode bar array 202 may have a height "H" (which is set by the number of bars and the bar spacing) of about 5 mm to about 30 mm, for example about 14.4 mm, and a width "W" (which is also set by the number of bars and the bar spacing) of about 15 mm to about 50 mm, for example about 34 mm. It is contemplated that the configuration, including spacing, pitch, and/or size of the diode bar 302 may vary depending upon the output power requirement. The laser diode bar array 202 with this particular geometry is believed to provide an optical beam having an aspect ratio favorable for homogenization by an array or arrays of microcylindrical lenses and for imaging of a beam line using lenses with spherical surfaces, as will be discussed in more detail below.

Figure 4A:
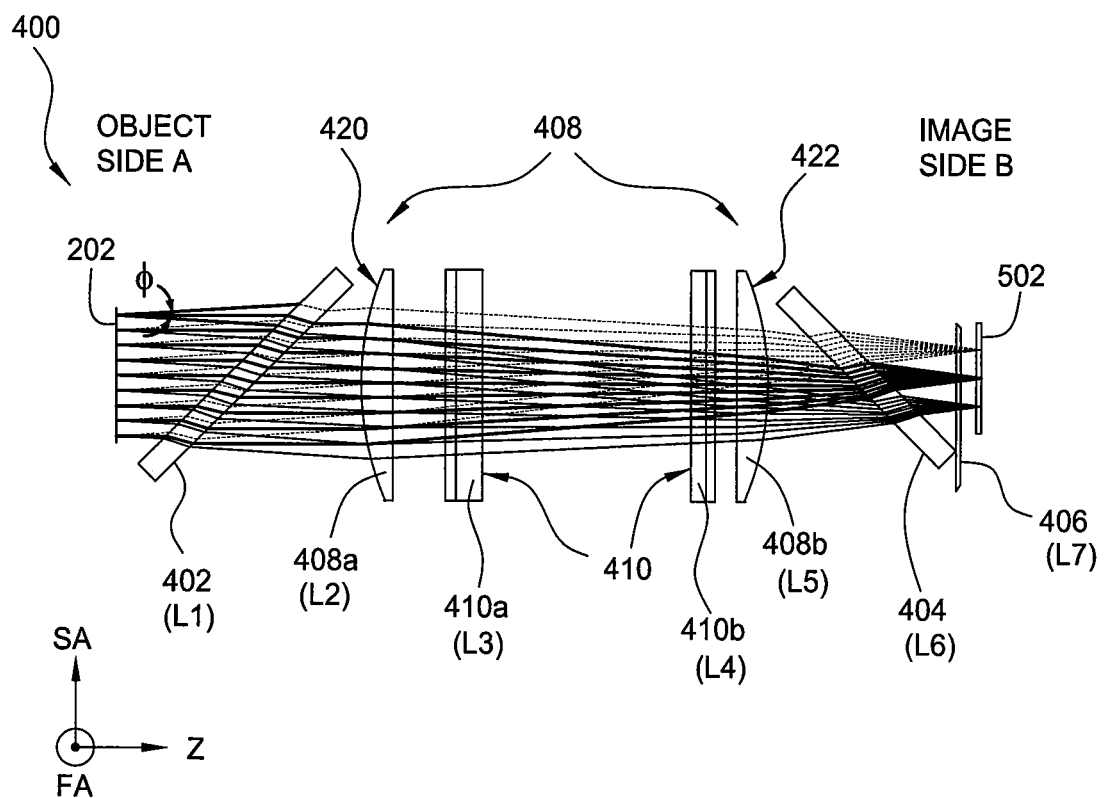
FIGS. 4A and 4B illustrate slow-axis and fast-axis views of output beams propagating through an exemplary illumination optics.
Figure 4B:
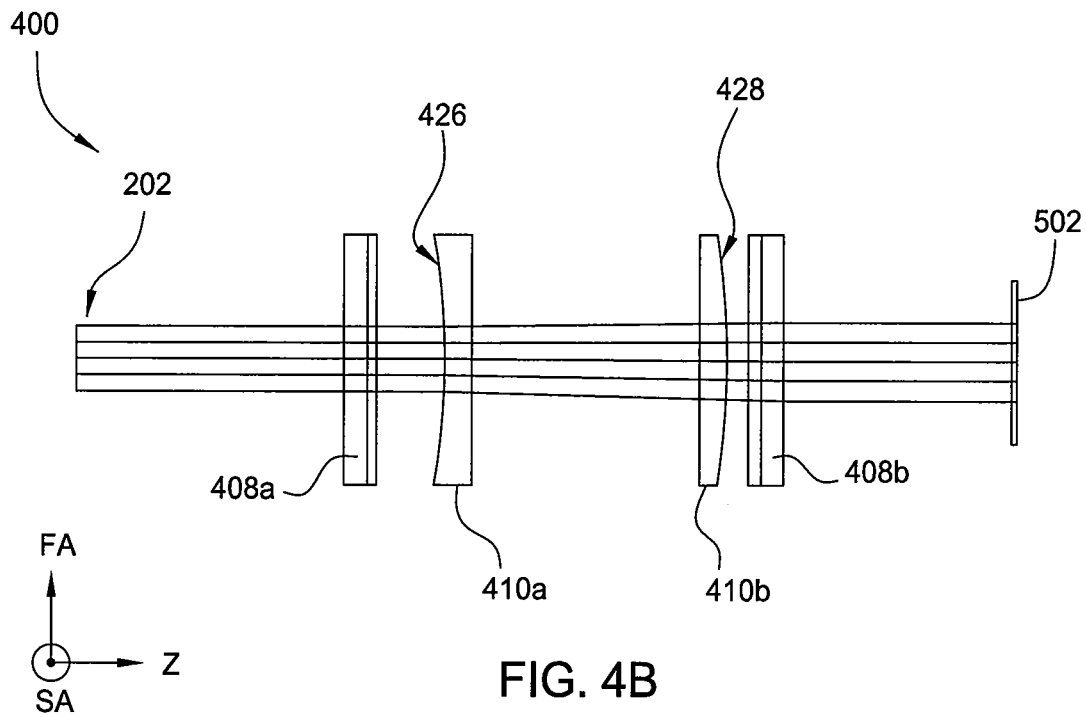

FIGS. 4A and 4B illustrate slow-axis and fast-axis views of output beams propagating through an exemplary illumination optics 400. The illumination optics 400 collimate and condense output beams from the laser diode bar array 202 with correct slow axis divergence and numerical aperture (NA) when the output beams reach the microlens array homogenizer 206. The illumination optics 400 also helps to eliminate the dependence of homogenizer illumination with laser diode current and to provide a constant angular slow axis illumination of the microlens array homogenizer 206. In one embodiment, the illumination optics 400 may include a polarizing beamsplitter 402 (identified as "L1" in the drawing), a pyrometer dichroic mirror 404 (identified as "L6"), a waveplate 406 (identified as "L7"), a set of slow-axis lenses 408 (identified as "L2" and "L5"), and a set of fast-axis lenses 410 (identified as "L3" and "L4"). The polarizing beamsplitter 402 may be disposed downstream of the laser diode bar array 202 and configured to generate one or both components that have orthogonal polarization directions. The polarizing beamsplitter 402 is configured to ensure that the output beams from the laser diode bar array 202 reaches the polarizing beamsplitter 402 with a specified linear polarization that will transmit the output beam along the optical axis Z (optical path), and to redirect light not of the specified linear polarization from the optical path to a beam dump (not shown). In one example, the polarizing beamsplitter 402 is positioned at an angle of about 45 degrees with respect to the slow axis. The waveplate 406, such as a quarter (λ/4) waveplate, may be disposed in the beam path, such as a location between the polarizing beamsplitter 402 and the microlens array homogenizer 206, such that linearly polarized beam that passes through the waveplate 406 becomes circularly polarized. In one example, the waveplate 406 is disposed between the pyrometer dichroic mirror 404 and the microlens array homogenizer 206.

After polarized beam passing through the set of slow-axis lenses 408, the set of fast-axis lenses 410, the pyrometer dichroic mirror 404, the waveplate 406, and the remainder of the optical system 200 (i.e., the microlens array homogenizer 206 and Fourier Transform lens 208 as shown in FIG. 2), some of the beam may be reflected from the surface of the wafer 22 back through the optical system 200. During such back transmission, the second encounter of the beam with the waveplate 406 causes the beam again to become linearly polarized, but rotated by 90°. Upon its second encounter with the polarizing beamsplitter 402, the laser radiation is directed to the beam dump, thereby protecting the laser diode bar array 202 from potential damage.

Figure 7:
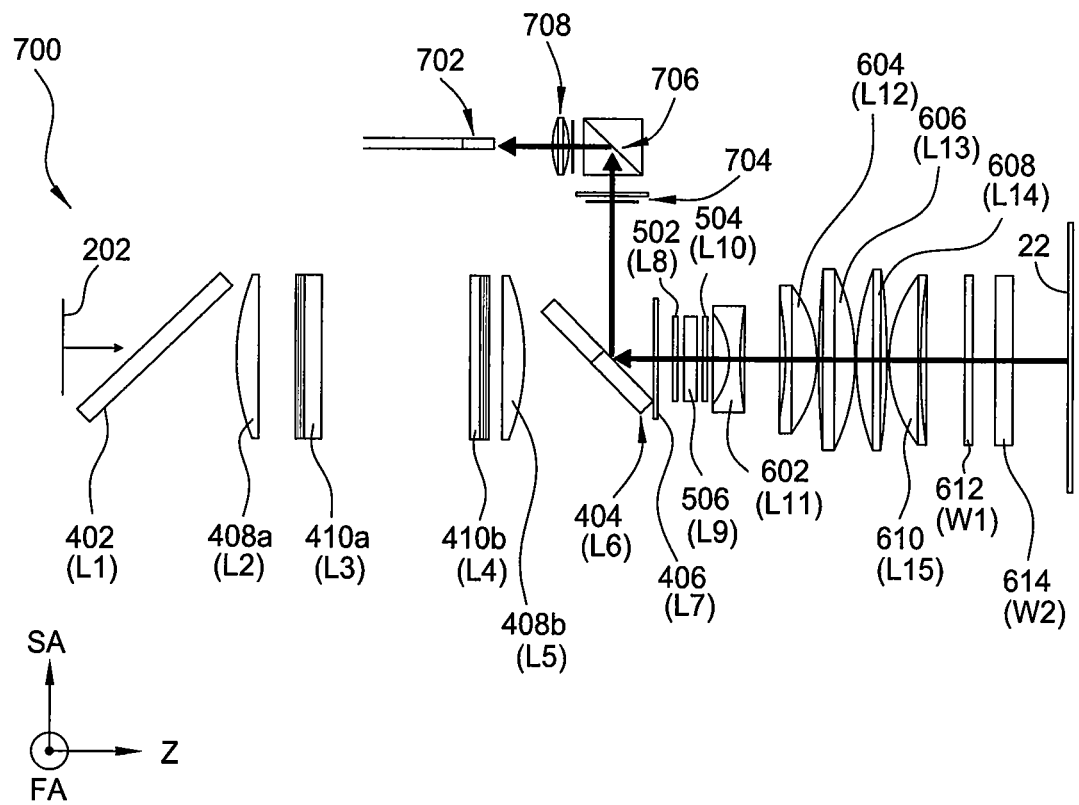
FIG. 7 illustrates slow-axis view of a lens arrangement of an optical system including a laser diode bar array, an illumination optics, a microlens array homogenizer, a Fourier Transform lens, and a pyrometer collection optics according to one embodiment of the invention.

Thermal radiation emitted from the heated wafer 22 having a wavelength of 950 nm or more is re-directed by the pyrometer dichroic mirror 404 to a pyrometer (FIG. 7). The output of the pyrometer is supplied to a controller (not shown), which converts the detected photocurrent to a wafer temperature and compares it to a desired temperature and thereby adjusts the power supplied to the laser diode bar array 202 (will be discussed in detail later).

The set of slow-axis lenses 408 may include, in order from an object side A to an image side B, a cylindrical lens 408a and a cylindrical lens 408b spaced apart from each other with effective focal length f of about 120 mm. The set of fast-axis lenses 410 is disposed between the cylindrical lenses 408a, 408b and may include, in order from an object side A to an image side B, a cylindrical lens 410a and a cylindrical lens 410b spaced apart so as to comprise a focal telescope or beam expander with magnification 1.1.8× in the fast axis direction. In one embodiment, the cylindrical lenses 408a has a convex lens surface 420 facing toward the object side A while the cylindrical lenses 408b has a convex lens surface 422 facing toward the image side B. The cylindrical lens 410a has a concave lens surface 426 facing toward the object side A while the cylindrical lens 410b has a convex lens surface 428 facing toward the image side B (FIG. 4B). A detailed prescription for the slow-axis lenses 408 (i.e., the cylindrical lens 408a and the cylindrical lens 408b) and fast-axis lenses 410 (i.e., the cylindrical lens 410a and the cylindrical lens 410b) in accordance with one embodiment of the invention is provided in Table 1 below.

TABLE 1

| Surface | Type | Radius SA (mm) | Radius FA (mm) | Thickness (mm) | Glass | Comment |
|---|---|---|---|---|---|---|
| L2 (OBJ side) | TOROIDAL | 75.14 | Infinity | 8 | SILICA | L2 Slow Axis Cylinder (408a) |
| L2 (IMG side) |  | Infinity | Infinity | 15.514 |  |  |
| L3 (OBJ side) | TOROIDAL | Infinity | −154.87 | 6.4 | SILICA | L3 Fast Axis Cylinder (410a) |
| L3 (IMG side) |  | Infinity | Infinity | 52.518 |  |  |
| L4 (OBJ side) |  | Infinity | Infinity | 6.4 | SILICA | L4 Fast Axis Cylinder (410b) |
| L4 (IMG side) | TOROIDAL | Infinity | −182.75 | 5 |  |  |
| L5 (OBJ side) |  | Infinity | Infinity | 8 | SILICA | L5 Slow Axis Cylinder (408b) |
| L5 (IMG side) | TOROIDAL | −86.43 | Infinity | 23 |  |  |

The laser diode bar array 202 is located in the front focal plane of the set of slow-axis lenses 408 of focal length f while the microlens array homogenizer 206 is located in the back focal plane. In operation, the slow-axis lenses 408 produce the beam with constant divergence angle along the slow axis. The beams are condensed and converged into the input end of the microlens array homogenizer 206, i.e., the pre-homogenizing lens array 502 in the direction of the optical axis Z, as shown in FIG. 4A. The inner fast-axis lenses 410 remove or decrease any residue divergence left over from the cylindrical lens on the laser diode. The beams are expanded and collimated in the direction of fast axis into the microlenses array homogenizer 206, as shown in FIG. 4B (the polarizing beam-splitter 402, the pyrometer dichroic mirror 404, and the waveplate 406 have been omitted for clarity). The set of slow-axis and fast-axis lenses 408, 410 transform the beam output of the laser diode bar array 202 so that the divergence is larger and constant (as discussed in the next paragraph) in the slow axis direction while making the divergence angle φ along the fast axis direction smaller. Smaller divergence angles traveling into the microlenses array homogenizer 206 in the fast axis means a tighter line focus at the wafer 22.

The illumination optics 400 help to deliver the laser beam with the correct slow axis divergence to the microlens array homogenizer 206, where the pre-homogenizing lens array 502 has a numerical aperture (NA) of about 0.15. To obtain good uniformity from the microlenses array homogenizer 206, it is important that the incident slow axis divergence not exceed the numerical aperture (NA) of the microlenes array homogenizer 206. In order to control the slow axis divergence incident at the microlens array homogenizer 206 (note the SA divergence from laser diode bar array 202 is a function of electrical current/power out), the diode array emission plane is optically Fourier transformed in the slow axis direction by the pair of cylindrical lenses 408a, 408b with effective focal length f of about 120 mm. Because of the properties of the optical Fourier transform (will be discussed later), light angles in the back focal plane are determined by the light spatial positions at the laser diode bar array 202. As the spatial emission pattern of the laser diode bar array 202 is uniform and independent of diode power and geometrically symmetrical, the divergence incident on the microlens array homogenizer 206 will likewise by uniform and independent of diode power. The slow axis spatial extent of beams at the microlens array homogenizer 206, on the other hand, is set by the slow axis divergence from the laser diode bar array 202, and may vary depending upon the process scheme. The illumination optics 400 decrease the fast axis divergence by about 1.18×, which is necessary in certain embodiments to insure the final line width at image plane of the wafer 22 meets the <80 μm FWHM requirement with a diode array fast axis divergence of 0.135°. It is noted that the fast-axis lenses 410 may be omitted if the diode array fast axis divergence meets the goal of)<0.12°.

Figure 5A:
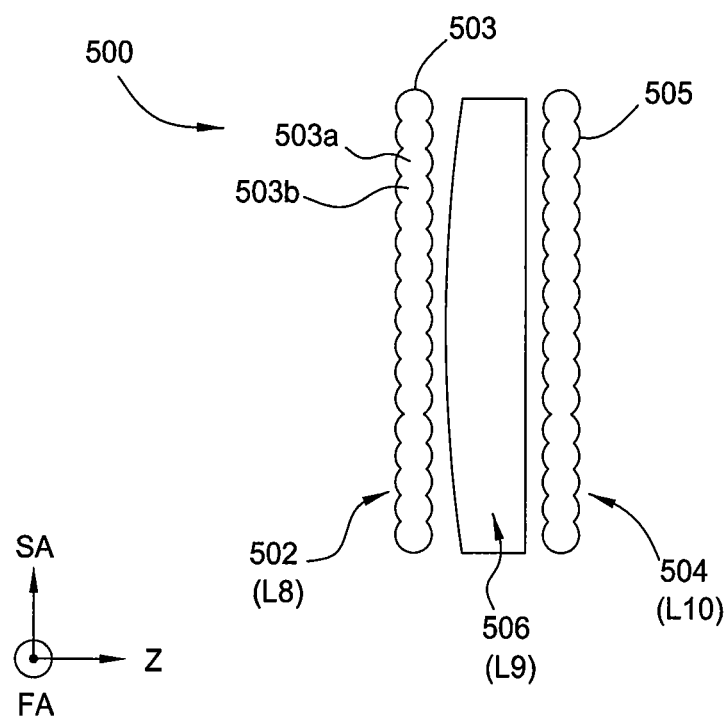
FIG. 5A illustrates slow-axis view of the microlens array homogenizer.

FIG. 5A illustrates slow-axis view of the microlens array homogenizer 500, such as the microlens array homogenizer 206 discussed above with respect to FIG. 2. The microlens array homogenizer 500 generally employs microlens array, such as a pre-homogenizing lens array 502 (identified as "L8" in the drawing) and a final homogenizing lens array 504 (identified as "L10") disposed parallel and spaced apart from the pre-homogenizing lens array 502 by the focal length of the lenses, to homogenize the laser beam along the slow axis. In cases where the pre-homogenizing lens array 502 and the final homogenizing lens array 504 are cylindrical lenslet arrays, the cylindrical lenslet axes of the pre-homogenizing lens array 502 and of the final homogenizing lens array 504 may be oriented along an axis that is parallel to a fast axis of the laser diode bar array 202. The microlens array homogenizer 500 may have numerical aperture (NA) specifically chosen to allow an all-spherical Fourier Transform lens 208. While two microlens arrays (i.e., 502,504) are shown, the microlens array homogenizer 500 may include more microlens arrays to reduce speckle in the final line image at the wafer.

Figure 5B:
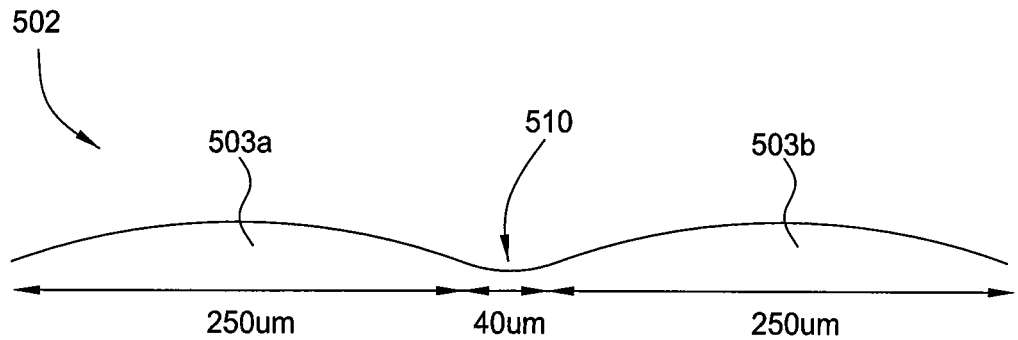
FIG. 5B illustrates a close-up, slow-axis view of a portion of the lenslet array of the pre-homogenizing lens array.

In operation, the output beams from the light source, i.e., the laser diode bar array 202, is focused by the cylindrical lenses of the illumination optics 204 as discussed above and entered the microlens array homogenizer 500 with a finite convergence angle along the slow axis, but substantially collimated along the fast axis. The microlens array homogenizer 500 reduces the beam structure along the slow axis introduced by the multiple laser diodes in the laser bar stack 304 (FIG. 3) spaced apart on the slow axis and smoothes out possible nonuniformities in the light source. The pre-homogenizing lens array 502 and the final homogenizing lens array 504 may be cylindrical lenses or lenses having a plurality of curved surfaces. In one embodiment shown in FIG. 5A, the pre-homogenizing lens array 502 and the final homogenizing lens array 504 generally include a micro-optic lenslet array of cylindrical lenses 503, 505, respectively. FIG. 5B illustrates a close-up, slow-axis view of a portion of the lenslet array of the pre-homogenizing lens array 502, for example. The lenslet array as shown includes two adjacent cylindrical lenses 503a, 503b with a transition region 510 located between the cylindrical lenses 503a, 503b. In the transition region 510 the surface profile approximates a concave cylindrical lens which smoothly connects to the convex cylindrical lenses 503a, 503b. The width of this transition region 510 affects the line length and edge-slope at the end of the line image. In one example, the transition region 510 is about 20 µm to about 60 µm in length, for example about 40 µm in length, and each of the cylindrical lenses 503a, 503b is about 180 µm to about 300 µm in length, for example about 250 µm in length.

As there is sufficient spatial coherence in the light incident on a microlens array which may lead to undesirable coherent artifacts at the final line image, an additional lens, for example, a weak cylindrical lens 506 (identified as "L9" in the drawing) may be placed in between the pre-homogenizing lens array 502 and the final homogenizing lens array 504 to help lessen these coherent non-uniformities. The weak cylindrical lens 506 may have a focal length of about 500 mm. It was shown above that to meet the image line length requirement using spherical optics in the subsequent Fourier Transform lens 208, the microlens array homogenizer 206 may require an microlens array (i.e., lens arrays 502, 504) with a numerical aperture NA of about 0.16 in the slow axis. The numerical aperture of the lens array can be expressed as follows:

$$NA = \frac{pitch \times FillFactor}{2 \times f} = \frac{pitch \times FillFactor \times (n-1)}{2 \times r},$$

where "pitch" is the lenslet array spacing (e.g., from center of cylindrical lens 503a to center of adjacent cylindrical lens 503b), "FillFactor" is the ratio of the lenslet width to the pitch, "f" is the focal length of a lenslet, "r" is the radius of curvature of the lenslet front and back surface, and "n" is the refractive index of the array material at the design wavelength. In cases where the lenslet array uses fused silica, the refractive index n is about 1.453 at λ of about 808 nm. The fillfactor of the lenslet array is determined primarily by the method of fabrication. In one embodiment the lenset array used in the pre-homogenizing lens array 502 and the final homogenizing lens array 504 are LIMO lens arrays (available from LIMO GmbH, Dortmund, Germany), the fillfactor has been measured to be greater than >90%. Table 2 below provides optical prescription for the pre-homogenizing lens array 502 and the final homogenizing lens array 504 used in the microlens array homogenizer 500 according to one embodiment of the invention. Microlens Array #1 represents the pre-homogenizing lens array 502, which serves to lessen coherent non-uniformity in the image line. The pre-homogenizing lens array 502 has a pitch of about 275 um, and an NA of about 0.155, slightly lower than microlens Array #2, which represents the final homogenizing lens array 504 having the same optical prescription as Array #1 except for a larger pitch of about 290 um, resulting in a larger NA of about 0.164. It has been observed experimentally that the microlens array homogenizer 500 works best when illuminated by incident light having a slow axis NA close to, but not exceeding, the lenslet array NA of the microlens array homogenizer 206. In particular, interference effects resulting from the spatial coherence of the laser diode bar array 202 are lessened by having the incident light NA close to the lenslet array NA. Therefore, a difference in pitch between the pre-homogenizing lens array 502 and the final homogenizing lens array 504 may be advantageous to reduce frequency interference between two lens arrays 502, 504 which would occur if they were to have identical pitches.

The optical parameters have been chosen to provide a pitch small enough that a sufficient number of lenslets, i.e., micro-optic lenslet array of cylindrical lenses 503, 505, are illuminated by the laser diode bar array 202 and the illumination optics 204. In one example, there may be approximately 50 cylindrical lenses 503, 505 in each of the pre-homogenizing lens array 502 and the final homogenizing lens array 504 covering about 15 mm beam width in the microlens array homogenizer 206.

TABLE 2

| Specification | Array #1 | Array #2 |
|---|---|---|
| Material | Fused silica | Fused silica |
| Width (along FA) | 30.0 +/− 0.05 mm | 30.0 +/− 0.05 mm |
| Height (along SA) | 30.0 +/− 0.05 mm | 30.0 +/− 0.05 mm |
| Thickness | 1.207 +/− 0.05 mm | 1.207 +/− 0.05 mm |
| Clear aperture | 28 × 28 mm^2 | 28 × 28 mm^2 |
| Pitch | 0.275 +/− 0.001 mm | 0.290 +/− 0.001 mm |
| Radius | 0.3764 +/− 0.0075 mm | 0.3764 +/− 0.0075 mm |
| FII factor | >90% | >90% |
| Numerical aperture (NA) | ~0.155 | ~0.164 |
| Surface quality | <50 nm p-v deviation from a cyl | <50 nm p-v deviation from a cyl |
| Transmission | >99% for 808 and 1020 nm, 0-30 deg | >99% for 808 and 1020 nm, 0-30 deg |
| Substrate edge alignment* | 0.2 mR | 0.2 mR |

*Max angle between substrate mechanical edge and lens array axis

Figure 6A:
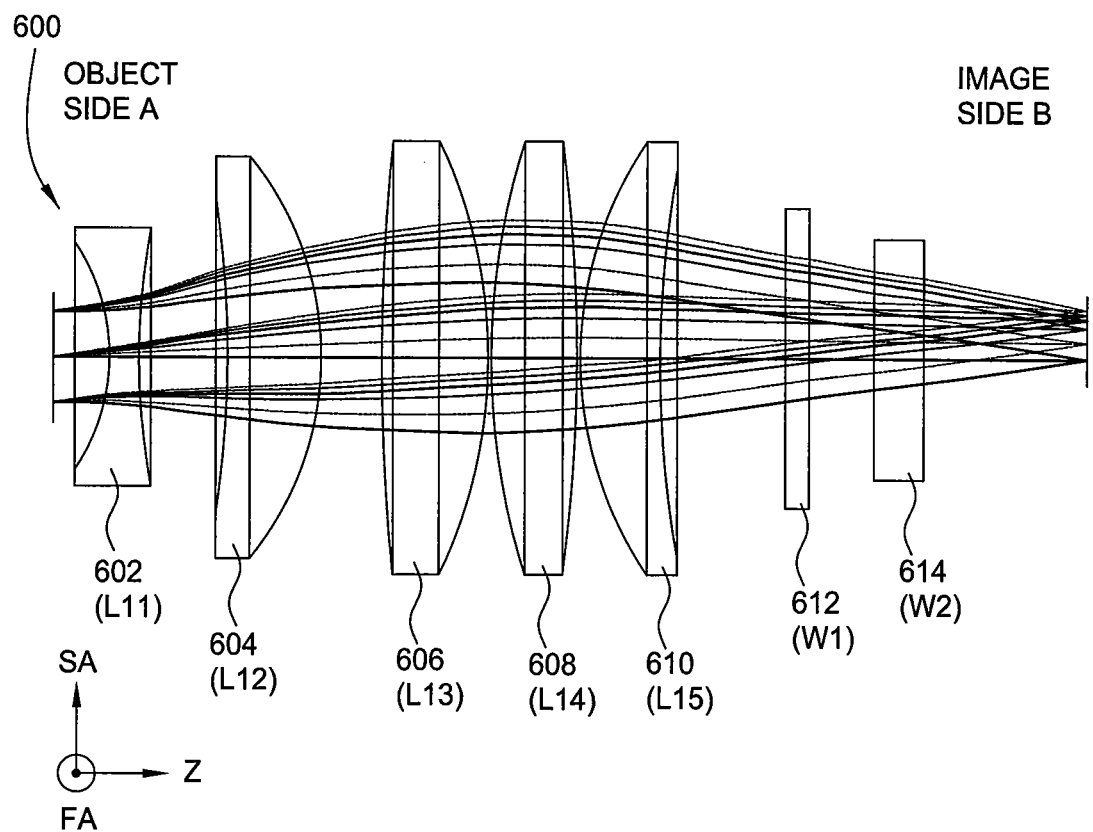
FIG. 6A illustrates slow-axis view of laser beams propagating through an exemplary Fourier Transform lens.

FIG. 6A illustrates slow-axis view of laser beams propagating through an exemplary condensing lens set 600, such as the Fourier Transform lens 208 discussed above with respect to FIG. 2. The condensing lens set 600 may be any suitable Fourier Transform lens, or the condensing lens set 600 with a particular lens arrangement as described below with respect to FIG. 6A. The Fourier Transform lens is designed to focus line image at the wafer 22 and having a specific optical distortion matched to the radiant intensity distribution produced by the final microlens array. The lens design is purposefully astigmatic which allows for a simpler design of fewer individual lens elements but still allows for quality imaging of a line image without negatively impacting the line uniformity. In one embodiment, the condensing lens set 600 generally includes lens array comprising, in order from an object side A to an image side B, five individual lenses, e.g., a first lens 602, a second lens 604, a third lens 606, a fourth lens 608, and a fifth lens 610 (identified as "L11", "L12," "L13," "L14," and "L15" respectively in the drawing) arranged along the optical axis Z and having all spherical surfaces. The condensing lens set 600 with all spherical lenses allows for more economical manufacturing and easier alignment compared to an anamorphic design that uses both cylindrical and spherical surface optics. A detailed prescription for each individual lens 602, 604, 606, 608, and 610 in accordance with one embodiment of the invention is provided in Table 3 below.

TABLE 3

| Surf Type | Radius | Thickness | Material | Diameter | Edge thickness (X-Edge/Y-Edge) |
|---|---|---|---|---|---|
| Object | Infinity | Infinity | | 0 | |
| Aperture Stop | Infinity | 6.880859 | | 8.248815 | 2.739422/2.739422 |
| L1 (OBJ side) | −25.73401 | 4 | SILICA | 28 | 9.320045/9.320045 |
| L1 (IMG side) | 109.192 | 10.87737 | | 32 | 8.249291/8.249291 |
| L2 (OBJ side) | −131.8937 | 11.5001 | SILICA | 39 | 4.117087/4.117087 |
| L2 (IMG side) | −39.79702 | 7.80948 | | 50 | 17.799024/17.799024 |
| L3 (OBJ side) | 315.5999 | 12.99995 | SILICA | 54 | 5.968442/5.968442 |
| L3 (IMG side) | −64.98561 | 0.5000262 | | 54 | 10.493407/10.493407 |
| L4 (OBJ side) | 90.55326 | 10.52833 | SILICA | 54 | 4.774647/4.774647 |
| L4 (IMG side) | −223.7871 | 0.4999986 | | 54 | 10.532183/10.532183 |
| L5 (OBJ side) | 47.60484 | 10.00019 | SILICA | 54 | 3.615662/3.615662 |
| L5 (IMG side) | 156.2545 | 15.6 | | 50 | 13.587088/13.587088 |
| W1 (OBJ side) | Infinity | 3 | SILICA | 37.16273 | 3.000000/3.000000 |
| W1 (IMG side) | Infinity | 8 | | 35.74045 | 8.000000/8.000000 |
| W2 (OBJ side) | Infinity | 6 | SILICA | 30.04821 | 6.000000/6.000000 |
| W2 (IMG side) | Infinity | 20.5 | | 27.20364 | 20.500000/20.500000 |
| Image | Infinity | | | 12.61728 | 0.000000/0.000000 |

FIG. 6A may also include a replaceable output window 612 (identified as W1 in the drawing) and a chamber window 614 (identified as W2 in the drawing). The replaceable output window 612 protects the interior of the optical system 200. Collimated laser beam may enter the chamber through the chamber window 614. In the thermal processing applications, the chamber window 614 may be larger than the wafer 22 being processed. This is because light access may be needed to all regions of the wafer as part of the processing. It is noted that the invention is not limited to this particular number of lenses and alternative embodiments may include a different number of lenses. The specific optical characteristics of each of the lenses and the way in which they are combined may define the shape of the overlaid images provided on surface of the wafer 22.

Figure 6B:
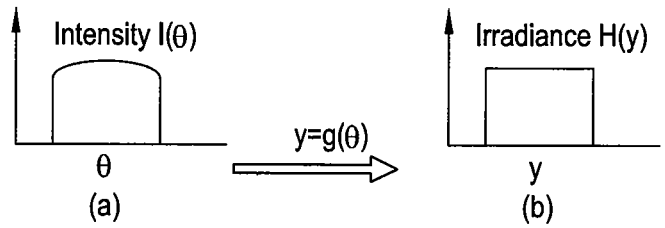
FIG. 6B illustrates a relationship between distortion function and normalized radiant intensity I(θ) as well as irradiance function H(y) for Fourier Transform lens.

The condensing lens set 600, such as the Fourier Transform lens 208, forms the final line image at the wafer 22 (FIG. 2). It is referred to as a Fourier Transform lens because the image is formed in its back focal plane. As such, the lens operates at infinite conjugate, mapping input beams at a given incident angle into a position in the image plane of the wafer 22. The generalized distortion function of the lens $g(\theta)$ determines the mapping of input angle $\theta$ into image position y as defined by $y=f\,g(\theta)$. The normalized radiant intensity $I(\theta)$ produced immediately after the final homogenizing lens array 504 is a measure of the optical power per radian, that is $I(\theta)d\theta$ is the power contained between the beam angles $\theta$ and $\theta+d\theta$ (for convenience, assume $I(0)=1$). Due to the aberrations inherent in the moderately high NA microlens array, the function $I(\theta)$ is not a top hat (see (a) of FIG. 6B), but rather is well-represented by a quadratic (see (b) of FIG. 6B), $I(\theta)=1+c_2\theta^2$. The normalized irradiance function $H(y)$ at the image plane of the wafer 22 is defined such that $H(y)\,dy$ is the power within the region y to y+dy. For a highly uniform irradiance, $H(y)$ is constant which is taken to be unity for convenience, and the distortion mapping $y=g(\theta)$ is the mapping which results in $H(y)=1$. By conservation of energy, one may obtain the following under the mapping $g(\theta)$ which converts angle $\theta$ into position y: $I(\theta)d\theta=H(y)dy$ or $$g'(\theta) = \frac{dy}{d\theta} = \frac{I(\theta)}{H(y)} = I(\theta)$$

since $H(y)=1$ for a uniform top-hat irradiance.

As the normalized radiant intensity produced by the final homogenizing lens array 504 can be represented by the quadratic $I(\theta)=1+c_2\theta^2$, an equation $$\frac{dy}{d\theta} = 1 + c_2\theta^2$$

is obtained. From here the final result is easily obtained for the desired generalized distortion mapping $$y = g(\theta) = \theta + \frac{c_2\theta^3}{3}.$$

This is the generalized distortion mapping which will result in a flat top irradiance $H(y)$ in the image plane of the wafer 22. The sole parameter is the radiant intensity quadratic coefficient $c_2$. Distortion in optical design is by convention specified relative to $\tan(\theta)$, because $\tan(\theta)$ is the mapping that maps an x-y object plane into an x'-y' image plane of the wafer 22 without distortion at finite object/image distances. Since $\tan(\theta)$ is about $\theta+\theta^3/3+\ldots$, one may assume $c_2=1$ for a lens having "zero" distortion by this convention. More specifically, by the definition used in common optical design software, the distortion of a lens characterized by the generalized mapping $g(\theta)$ defined above may be defined as $$\text{design\_distortion} = \frac{g(\theta) - \tan(\theta)}{\tan(\theta)} = \frac{\theta + \frac{1}{3}c_2\theta^3 - \tan(\theta)}{\tan(\theta)}.$$

Therefore, once $c_2$ is known, one can specify the distortion needed in each individual lens of the condensing lens set 600. In one example where the condensing lens set 600 is a Fourier transform lens and the quadratic curve fit to the radiant intensity yields $c_2=-1.35$, the desired Fourier transform lens distortion (departure from $\tan(\theta)$ distortion) is −2.14% at a field angle of 1.66 radians or 9.5°. The merit function used to design the Fourier Transform lens is defined to minimize the image spot size in the fast-axis direction. In various embodiments, the condensing lens set 600 is configured to provide: (1) effective focal length of about 38 mm, which is set by fast axis divergence to satisfy 80 mm FWHM linewidth as discussed above; (2) input field angles (slow axis) of ±9.5°, which is set by NA (about 0.164) of the microlens array homogenizer 206; (3) a back focal length (i.e., the chamber window 614 to image at the wafer 22) of about 20.5 mm; and (4) a distortion (relative to tan(θ)) of about −2.14% at maximum field angle 9.5°. Further prescription of the condensing lens set 600 in accordance with one of the present invention can be found in Table 3 above and Table 4 below.

TABLE 4

| | |
|---|---|
| System Aperture | Entrance Pupil Diameter = 22.63 |
| Temperature (C.) | 2.00000E+001 |
| Pressure (ATM) | 1.00000E+000 |
| Effective Focal Length | 38.00002 |
| | (in air at system temperature/pressure) |
| Effective Focal Length | 38.00002 |
| | (in image space) |
| Back Focal Length | 20.55506 |
| Total Track | 128.6963 |
| Image Space F/# | 1.679188 |
| Paraxial Working F/# | 1.679188 |
| Working F/# | 1.679959 |
| Image Space NA | 0.2853803 |
| Object Space NA | 1.1315e−009 |
| Stop Radius | 11.315 |
| Paraxial Image Height | 6.359023 |
| Paraxial Magnification | 0 |
| Entrance Pupil Diameter | 22.63 |
| Entrance Pupil Position | 0 |
| Exit Pupil Diameter | 132.5966 |
| Exit Pupil Position | 222.7096 |
| Field Type | Angle in degrees |
| Maximum Radial Field | 9.5 |
| Primary Wavelength | 0.808 μm |
| Lens Units | Millimeters |
| Angular Magnification | −0.1706681 |

While the condensing lens set 600 may be constructed to minimize the image spot size in the fast-axis direction, the use of all spherical lenses may allow the lens to exhibit astigmatism. Image spot growth in the slow axis direction causes an insignificant line lengthening and softening at the line ends. However, it has been shown that such a lens design is not a detriment for a line width in the fast axis direction but rather allows for a simpler design of fewer individual lens elements with quality imaging of a line image without negatively impacting the line uniformity. It is contemplated that the number of lens used in the condensing lens set 600 is not limited to five spherical elements as discussed. A skilled artisan may add or remove the lens as necessary using the equation above to optimize the distortion needed in each individual lens of the condensing lens set 600.

FIG. 7 illustrates slow-axis view of a lens arrangement of an optical system 700 including a laser diode bar array 202, an illumination optics (402, 408a-b 410a-b, 404 and 406), a microlens array homogenizer (502, 504, and 506), and a condensing lens set (602, 604, 606, 608, 610, 612, and 614) as discussed above, and a pyrometer collection optics (702, 704, 706, and 708) according to one embodiment of the invention. In FIG. 7, the optical axis from one or more electromagnetic sources (i.e., laser diode bar array 202) to a surface of the wafer 22 is designated as the Z axis. The slow axis ("SA") of the optical system 700 in this drawing is identified, with the fast axis ("FA") being orthogonal to the page as shown. As briefly discussed above with respect to FIG. 4A, in order to regulate or control the wafer temperature, the temperature of the illuminated portion of the wafer 22 is constantly monitored by the pyrometer collection optics. The same optics used to collimate and focus the laser source beam on the wafer 22 are employed to direct thermal radiation emitted from the heated wafer 22 in the reverse direction to a pyrometer 702. The thermal radiation may be back-propagated through the condensing lens set (602, 604, 606, 608, 610, 612, and 614), the microlens array homogenizer (502, 504, and 506), and to the pyrometer dichoric mirror 404 with a coating (e.g., $SiO_2$ and/or $Ta_2O_5$) having simultaneously high reflectivity at the pyrometry wavelengths (e.g., 940 nm and 1550 nm) and high transmission at the primary laser wavelength 808 nm. Upon its second encounter with the pyrometer dichroic mirror 404, thermal radiation emitted from the heated wafer 22 having a wavelength of 940±5 nm or 1550±5 nm is re-directed by the pyrometer dichroic mirror 404 to an optical filter 704 blocking the wavelength, e.g., 808 nm, of the laser radiation. The laser radiation with the pyrometry wavelengths are reflected by an optional prism 706 to a lens 708 which focuses the laser radiation onto a face of the pyrometer 702. The output of the pyrometer is supplied to a controller (not shown), which converts the detected photocurrent to a wafer temperature and compares it to a desired temperature and thereby adjusts the power supplied to the laser diode bar array 202.

While the foregoing is directed to embodiments of the present invention, other and further embodiments of the invention may be devised without departing from the basic scope thereof, and the scope thereof is determined by the claims that follow.

The invention claimed is:

1. A thermal processing apparatus for processing a semiconductor substrate, comprising:
    a substrate support;
    a source of laser radiation for emitting laser radiation along an optical path;
    an illumination optics disposed along the optical path, comprising:
        a set of slow-axis lenses having at least a first cylindrical lens and a second cylindrical lens spaced apart from each other; and
        a set of fast-axis lenses having at least a first cylindrical lens and a second cylindrical lens spaced apart from each other, the set of fast-axis lenses being disposed between the first cylindrical lens and the second cylindrical lens of the set of slow-axis lenses; and
    a homogenizer disposed between the illumination optics and the substrate support along the optical path, the homogenizer comprising:
        a first lens array; and
        a second lens array, wherein the lenses of the second lens array have a larger pitch than the lenses of the first lens array, and axes of the lenses of the first lens array and axes of the lenses of the second lens array are oriented parallel to a fast axis of the source of laser radiation.

2. The apparatus of claim 1, further comprising:
    a plurality of condensing lenses disposed between the homogenizer and the substrate support along the optical path, wherein the plurality of condensing lenses comprises at least five spherical lenses.

3. The apparatus of claim 1, wherein the first lens array and the second lens array each has a plurality of curved surfaces.

4. The apparatus of claim 1, wherein the first lens array and the second lens array are cylindrical lenses.

5. The apparatus of claim 1, wherein the source of laser radiation comprises 27 laser diode bars grouped in a 3×9 array.

6. The apparatus of claim 1, wherein the first cylindrical lens of the set of slow-axis lenses has a convex lens surface facing toward the source of laser radiation and the second cylindrical lens of the set of slow axis lenses has a convex lens surface facing toward the surface of the substrate.

7. The apparatus of claim 6, wherein the first cylindrical lens of the set of fast-axis lenses has a concave lens surface facing toward the source of laser radiation and the second cylindrical lens of the set of fast-axis lenses has a convex lens surface facing toward the surface of the substrate.

8. The apparatus of claim 1, wherein the first lens array of cylindrical lenses has a numerical aperture NA of about 0.15.

9. A thermal processing apparatus for processing a semiconductor substrate, comprising:
a substrate support;
an array of laser diode bars emitting laser radiation at a first wavelength, the array of laser diode bars being arranged in plural parallel rows extending along a slow axis, the rows of laser diode bars being arranged in a stack along a fast axis, wherein the slow axis and the fast axis are orthogonal to an optical path between the array of laser diode bars and the substrate support;
an illumination optics disposed between the array of laser diode bars and the substrate support along the optical path, the illumination optics comprising:
a polarizing beamsplitter;
a set of slow-axis lenses having at least a first cylindrical lens and a second cylindrical lens spaced apart from each other;
a set of fast-axis lenses having at least a first cylindrical lens and a second cylindrical lens spaced apart from each other, the set of fast-axis lenses being disposed between the first cylindrical lens and second cylindrical lens of the set of slow-axis lenses;
a dichroic mirror disposed downstream of the set of fast-axis lenses and configured to redirect laser radiation of a second and a third wavelengths reflected from the heated substrate to a pyrometer; and
a waveplate disposed downstream of the dichroic mirror to transform the linear polarization of laser radiation into circular polarization;
a homogenizer disposed between the illumination optics and the substrate support along the optical path for homogenizing laser radiation along the slow axis, the homogenizer comprising:
a first lens array; and
a second lens array, the lenses of the second lens array having a larger pitch than the lenses of the first lens array; and
a condensing lens set disposed between the homogenizer and the substrate support along the optical path for focusing line image at a surface of the substrate, the condensing lens set comprising at least five spherical lenses.

10. The apparatus of claim 9, wherein the array of laser diode bars comprises 27 diode bars grouped in a 3×9 array.

11. The apparatus of claim 9, wherein the first cylindrical lens of the set of slow-axis lenses has a convex lens surface facing toward the array of laser diode bars and the second cylindrical lens of the set of slow-axis lenses has a convex lens surface facing toward the surface of the substrate.

12. The apparatus of claim 9, wherein the first cylindrical lens of the set of fast-axis lenses has a concave lens surface facing toward the array of laser diode bars and the second cylindrical lens of the set of fast-axis lenses has a convex lens surface facing toward the surface of the substrate.

13. The apparatus of claim 9, wherein axes of the first lens array and axes the second lens array are oriented parallel to a fast axis of the source of laser radiation.

14. The apparatus of claim 9, wherein the first wavelength is approximately 808 nm, the second wavelength is approximately 940 nm, and the third wavelength is approximately 1550 nm.

15. The apparatus of claim 9, wherein the homogenizer further comprising:
a weak cylindrical lens placed in between the first lens array of cylindrical lenses and the second lens array of cylindrical lenses.

16. A thermal processing apparatus for processing a semiconductor substrate, comprising:
a substrate support;
an array of laser diode bars arranged in plural parallel rows extending along a slow axis, the rows of laser diode bars being arrayed in a stack along a fast axis, the slow-axis being generally perpendicular to the fast-axis;
an illumination optics disposed between the array of laser diode bars and the substrate support, the illumination optics comprising:
a set of slow-axis lenses having at least a first cylindrical lens and a second cylindrical lens spaced apart from each other, the set of slow-axis lenses collimate laser beam radiation in the slow axis; and
a set of fast-axis lenses having at least a first cylindrical lens and a second cylindrical lens spaced apart from each other, the set of fast-axis lenses being disposed between the first and second cylindrical lenses of the set of slow-axis lenses to collimate laser beam radiation in the fast axis; and
a homogenizer disposed between the illumination optics and the substrate support for homogenizing laser beam radiation collimated by the illumination optics along the slow axis, the homogenizer comprising:
a first lens array of cylindrical lenses; and
a second lens array of cylindrical lenses disposed parallel and spaced apart from the first lens array of cylindrical lenses, wherein the lenses of the second lens array of cylindrical lenses have a larger pitch than the lenses of the first lens array of cylindrical lenses, and axes of the first lens array and axes of the second lens array are oriented parallel to a fast axis of the source of laser radiation; and
a condensing lens set disposed between the homogenizer and the substrate support along an optical path intersecting the substrate support for focusing line image at a surface of the substrate, the condensing lens set comprising at least five spherical lenses.

17. The apparatus of claim 16, wherein the first cylindrical lens of the set of slow-axis lenses has a convex lens surface facing toward the array of laser diode bars and the second cylindrical lens of the set of slow-axis lenses has a convex lens surface facing toward the surface of the substrate.

18. The apparatus of claim 16, wherein the first cylindrical lens of the set of fast-axis lenses has a concave lens surface facing toward the array of laser diode bars and the second cylindrical lens of the set of fast-axis lenses has a convex lens surface facing toward the surface of the substrate.

19. The apparatus of claim 16, wherein the set of slow-axis and fast-axis lenses have optical prescription shown in Table 1 (L2-L5) of the specification.

20. The apparatus of claim 16, wherein the first and second lens array of cylindrical lenses have optical prescription shown in Table 2 of the specification.

21. The apparatus of claim 16, wherein the condensing lens set has optical prescription shown in Table 3 (L1-L5) and Table 4 of the specification.

* * * * *